(12) United States Patent
Alhussien et al.

(10) Patent No.: US 9,582,359 B2
(45) Date of Patent: Feb. 28, 2017

(54) WRITE MAPPING TO MITIGATE HARD ERRORS VIA SOFT-DECISION DECODING

(71) Applicant: Seagate Technology LLC, Cupertino, CA (US)

(72) Inventors: AbdelHakim S. Alhussien, San Jose, CA (US); Erich F. Haratsch, San Jose, CA (US); Earl T. Cohen, Oakland, CA (US); Yunxiang Wu, Cupertino, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/963,723

(22) Filed: Dec. 9, 2015

(65) Prior Publication Data

US 2016/0098317 A1 Apr. 7, 2016

Related U.S. Application Data

(63) Continuation of application No. 14/311,645, filed on Jun. 23, 2014, now Pat. No. 9,213,602.

(51) Int. Cl.
*G06F 11/10* (2006.01)
*G11C 29/52* (2006.01)
(Continued)

(52) U.S. Cl.
CPC ........ *G06F 11/1068* (2013.01); *G11C 7/1006* (2013.01); *G11C 11/5628* (2013.01);
(Continued)

(58) Field of Classification Search
CPC ............. G06F 11/1068; G06F 11/1016; G06F 11/1072; G11C 29/52; G11C 11/5628; G11C 16/10; H03M 13/458; H03M 13/256; H03M 13/2906; H03M 13/45; H03M 13/1102; H03M 13/152
See application file for complete search history.

(56) References Cited

U.S. PATENT DOCUMENTS

| 4,232,197 A | * | 11/1980 | Acampora | ........... H04B 7/2046 370/321 |
| 8,484,535 B2 | | 7/2013 | Graef et al. | ................... 714/764 |

(Continued)

*Primary Examiner* — April Y. Blair
*Assistant Examiner* — Dipakkumar Gandhi
(74) *Attorney, Agent, or Firm* — Christopher P. Maiorana, PC

(57) ABSTRACT

An apparatus having mapping and interface circuits. The mapping circuit (i) generates a coded item by mapping write unit bits using a modulation or recursion of past-seen bits, and (ii) calculates a particular state to program into a nonvolatile memory cell. The interface circuit programs the cell at the particular state. Two normal cell states are treated as at least four refined states. The particular state is one of the refined states. A mapping to the refined states mitigates programming write misplacement that shifts an analog voltage of the cell from the particular state to an erroneous state. The erroneous state corresponds to a readily observable illegal or atypical write sequence, and results in a modified soft decision from that calculated based on the normal states only. A voltage swing between the particular state and the erroneous state is less than between the normal states.

20 Claims, 5 Drawing Sheets

(51) Int. Cl.
*H03M 13/45* (2006.01)
*G11C 7/10* (2006.01)
*G11C 11/56* (2006.01)
*G11C 16/10* (2006.01)
*G11C 27/00* (2006.01)
*H03M 13/25* (2006.01)
*H03M 13/29* (2006.01)
*G06F 11/32* (2006.01)
*H03M 13/11* (2006.01)
*H03M 13/15* (2006.01)

(52) U.S. Cl.
CPC ............ *G11C 16/10* (2013.01); *G11C 27/005* (2013.01); *G11C 29/52* (2013.01); *H03M 13/256* (2013.01); *H03M 13/2906* (2013.01); *H03M 13/45* (2013.01); *H03M 13/458* (2013.01); *H03M 13/1102* (2013.01); *H03M 13/152* (2013.01)

(56) References Cited

U.S. PATENT DOCUMENTS

| | | | |
|---|---|---|---|
| 8,495,467 B1 | 7/2013 | Billing et al. | 714/764 |
| 8,499,229 B2 | 7/2013 | Roohparvar et al. | 714/795 |
| 2003/0174622 A1* | 9/2003 | Nagai | G11B 7/0062 369/59.22 |
| 2005/0091566 A1* | 4/2005 | Berens | H03M 13/2957 714/755 |
| 2007/0171714 A1 | 7/2007 | Wu et al. | 365/185.09 |
| 2008/0151617 A1* | 6/2008 | Alrod | G06F 11/1068 365/185.2 |
| 2009/0019321 A1 | 1/2009 | Radke | 714/54 |
| 2009/0231745 A1* | 9/2009 | Venkataramani | G11B 20/10009 360/39 |
| 2010/0246287 A1 | 9/2010 | Vigoda et al. | 365/189.15 |
| 2012/0224404 A1 | 9/2012 | Gurgi et al. | 365/45 |
| 2013/0019054 A1* | 1/2013 | Jung | G06F 12/0246 711/103 |
| 2014/0289450 A1* | 9/2014 | Wu | G06F 11/1064 711/103 |
| 2015/0162057 A1* | 6/2015 | Alhussien | G11C 13/004 365/189.11 |

\* cited by examiner

WRITE MAPPING TO MITIGATE HARD ERRORS VIA SOFT-DECISION DECODING

This application relates to U.S. Ser. No. 14/311,645, filed Jun. 23, 2014, and relates to co-pending U.S. application Ser. No. 14/308,911, filed Jun. 19, 2014, each of which are hereby incorporated by reference in their entirety.

FIELD OF THE INVENTION

The invention relates to write errors in nonvolatile memories generally and, more particularly, to a method and/or apparatus for implementing a write mapping to mitigate hard errors via soft-decision decoding.

BACKGROUND

Various mechanisms in flash memories result in single write errors as a dominant type of read errors, especially at good signal-to-noise ratios. Some of the write error mechanisms that severely affect soft-decision decoding success include: cells stuck at certain states that resist being programmed to other states or are mis-programmed; reading lower-page-only pages before writing multi-level-cell wordlines; compacting single-cell pages into a triple-level-cell page; and other read-side issues that have the same effect on soft information as the write errors. An example of read-side issues occurs in read retry methods where a voltage read window is not wide enough to capture errors and so saturated fixed point log-likelihood ratio values are generated.

SUMMARY

The invention concerns an apparatus having a mapping circuit and an interface circuit. The mapping circuit (i) generates a coded item by mapping write unit bits using a modulation or recursion of past-seen bits, and (ii) calculates a particular state to program into a nonvolatile memory cell. The interface circuit programs the cell at the particular state. Two normal cell states are treated as at least four refined states. The particular state is one of the refined states. A mapping to the refined states mitigates programming write misplacement that shifts an analog voltage of the cell from the particular state to an erroneous state. The erroneous state corresponds to a readily observable illegal or atypical write sequence, and results in a modified soft decision from that calculated based on the normal states only. A voltage swing between the particular state and the erroneous state is less than between the normal states.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 1:
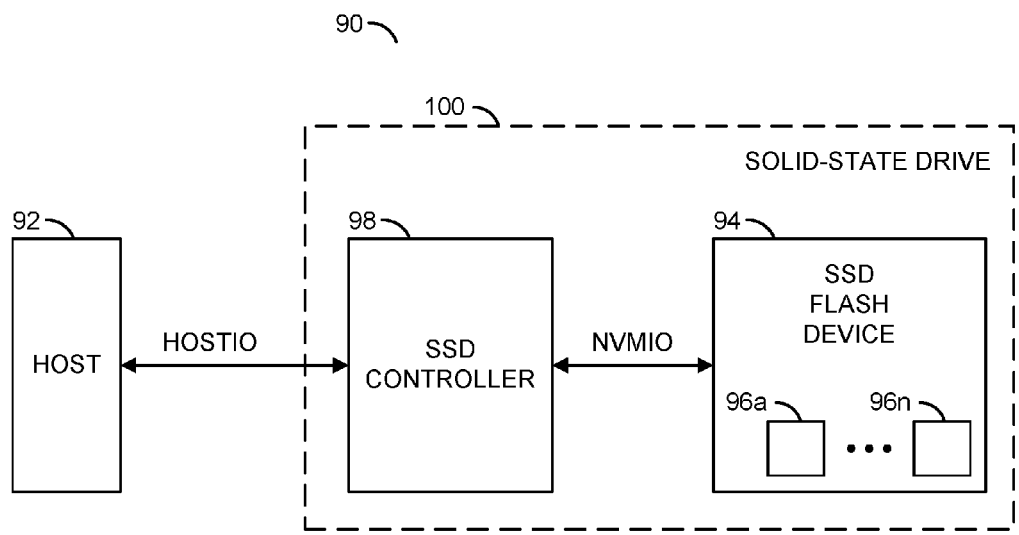
FIG. 1 is a block diagram of an apparatus.

Embodiments of the invention include providing a write mapping to mitigate hard errors via soft-decision decoding that may (i) reduce performance degradation due to write errors where soft-decision decoding is implemented, (ii) add memory and/or parity bits to generate extra states, (iii) incorporate intentional inter-cell interference to modify soft-decision information, (iv) avoid saturated soft-decision information for improperly written bits, (v) increase a Euclidean space distance between likely sequences and/or (vi) be implemented as one or more integrated circuits.

Various embodiments of the invention map write data units in nonvolatile (e.g., flash) memories to analog storage states that reduce the performance degradation effect of write errors when soft-decision decoding is used as part of the error correction coding strategy. The data mapping adds interdependencies between bits in a codeword, page and/or block so that soft-decision information generated by the detector provides a better indication of likely error positions by virtue of the modified and/or erased corresponding log-likelihood ratio (e.g., LLR) values. The data mapping technique introduces state memory (e.g., current state depends on past states) and may add redundancy or be rate-less, be recursive or non-recursive, and/or be systematic or non-systematic. The mapping is achieved by dividing a voltage window between two neighboring original states into multiple voltage states, where single write errors do not correspond to a full voltage swing between the voltage window extremes. Therefore, single write errors do not result in saturated or high magnitude log-likelihood ratio values since any single write error would not correspond to any typical sequence of transitions between intermediate states.

In various embodiments, the mapping function is used to introduce intentional inter-cell dependencies to store at least some information about a current bit in the values of other bits to protect against a total loss of information caused by mis-programming the cell holding the current bit. In such a case, user information is stored as sequences of bits (an encoded unit) rather than single bits. Therefore, the receiver/reader may read several cells to calculate the soft-decision information or likelihood of the current bit.

The mapping increases Euclidean-space distances between likely sequences (typical or legitimate) from a single bit error to multiple bit errors. The increased distances help prevent single bit errors from resulting in high confidence log-likelihood ratio values that affect a convergence success rate of the soft-decision decoder.

In some embodiments, trellis coded modulation is used. The trellis coded modulation adds redundancy using a convolutional type code. The multi-bit coded symbols are mapped into more states than the useful states to represent user bits. In other embodiments, a mapping function is used to introduce intentional inter-cell dependencies to store at least some information about the current bit in the value of other bits. The dependencies protect against the total loss of information caused by mis-programming the cell holding the current bit. In other embodiments, a recursion of past-seen bits is used. The recursion is generally an application of a function to the past values created by the function to generate an infinite sequence of values.

Various mechanisms in flash memories result in single write errors as a dominant type of read errors, especially dominant at good signal-to-noise ratios typical of the beginning of flash life. Some of the write error mechanisms that affect soft-decision decoding success include, but are not limited to, cells stuck at certain states (e.g., a logical one erased state or a logical zero programmed state) that resist being programmed to other states; bit-line defects; cells that are mis-programmed; reading intermediate states, such as lower-page-only (e.g., LPO) pages, before writing multi-level-cell (e.g., MLC) wordlines; compacting single-level-cell pages into a triple-level-cell page; and read retry methods where the voltage read window is not wide enough to capture errors and thus saturated, fixed-point, log-likelihood-ratio values are generated.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94, one or more blocks (or circuits) 96a-96n and a block (or circuit) 98. The circuits 94 and 98 form a drive (or device) 100. The circuits 92 to 100 may be represented as modules and/or blocks, embodiments of which include hardware (circuitry), code (e.g., hardware description languages (HDLs) such as register-transfer level (RTL), Verilog, etc.) used by one or more electronic design tools, computer executable code in a storage device, software and associated hardware executing the software, and/or other implementations.

One or more signals (e.g., HOSTIO) are exchanged between the circuit 92 and the circuit 98. The host input/output signal HOSTIO generally includes, but is not limited to, a logical address component used to access data in the circuit 100, a host command component that controls the circuit 100, a write data component that transfers write data from the circuit 92 to the circuit 98 and a read data component that transfers error corrected read data from the circuit 98 to the circuit 92. One or more signals (e.g., NVMIO) are exchanged between the circuit 98 and the circuit 94. The nonvolatile memory input/output signal NVMIO generally includes, but is not limited to, a physical address component used to access data in the circuit 94, a memory command component that controls the circuit 94 (e.g., read or write commands), a write codeword component that carries error correction coded and cyclical redundancy check protected write codewords written from the circuit 98 into the circuit 94 and a read codeword component that carries the error correction coded codewords read from the circuit 94 to the circuit 98.

The circuit 92 is shown implemented as a host circuit. The circuit 92 is generally operational to read and write data to and from the circuit 94 via the circuit 98. When reading or writing, the circuit 92 transfers a logical address value in the signal HOSTIO to identify which set of data is to be written into or to be read from the circuit 94. The address generally spans a logical address range of the circuit 100. The logical address can address individual data units, such as BATA (e.g., serial-ATA) sectors.

The circuit 94 is shown implementing one or more nonvolatile memory circuits (or devices) 96a-96n. According to various embodiments, the circuit 94 comprises one or more nonvolatile semiconductor devices. The circuit 94 is generally operational to store data in a nonvolatile condition. When data is read from the circuit 94, the circuit 94 accesses a set of data (e.g., multiple bits) identified by the address (e.g., a physical address) in the signal NVMIO. The address generally spans a physical address range of the circuit 94.

Data within the circuit 94 is generally organized in a hierarchy of units. An erase block is a smallest quantum of erasing. A page is a smallest quantum of writing. A codeword (or read unit or Epage or an error correction code page) is a smallest quantum of reading and error correction. Each block includes an integer number of pages with some padding bits where suitable. Each page generally includes an integer number of codewords. In some embodiments, codewords are enabled to span a page boundary of a multi-page unit. For example, some nonvolatile memory types are organized in planes that are operable in parallel, each plane comprising a plurality of the blocks. A multi-page unit, selected as a page from each plane, is thus writeable and readable as a single unit.

The circuits 96a-96n are generally implemented as NAND flash memory, NOR flash memory, flash memory using polysilicon or silicon nitride technology-based charge storage cells, two-dimensional or three-dimensional technology-based nonvolatile memory, ferromagnetic memory, phase-change memory, racetrack memory, resistive random access memory, magnetic random access memory and similar types of memory devices and/or storage media. Other nonvolatile memory technologies may be implemented to meet the criteria of a particular application.

In some embodiments, the circuits 96a-96n may be implemented as single-level-cell (e.g., SLC) type circuits. A single-level-cell type circuit generally stores a single bit per memory cell (e.g., a logical 0 or 1). In other embodiments, the circuits 96a-96n may be implemented as multi-level-cell type circuits. A multi-level-cell type circuit is capable of storing multiple (e.g., two) bits per memory cell (e.g., logical 00, 01, 10 or 11). In still other embodiments, the circuits 96a-96n may implement triple-level-cell type circuits. A triple-level-cell circuit stores multiple (e.g., three) bits per memory cell (e.g., a logical 000, 001, 010, 011, 100, 101, 110 or 111). A four-level cell type circuit may also be implemented. The examples provided are based on two bits per cell type devices and may be applied to all other types of nonvolatile memory.

As part of storing units of data, each circuit 96a-96n is configured to program the nonvolatile memory cells at particular states. Two normal states of each cell are treated as at least four refined states during the programming. The particular states are ones of the refined states. A mapping to the refined states mitigates a write misplacement during programming that shifts an analog voltage of a cell from the particular state to an erroneous state of the refined states. The erroneous state corresponds to an illegal or atypical write sequence that is readily observable. The erroneous state generally results in a modified soft decision from that calculated based on the normal states only. A voltage swing between the particular state and the erroneous state is less than between the normal states.

The circuit 98 is shown implementing a controller circuit. The circuit 98 is generally operational to control reading from and writing to the circuit 94. The circuit 98 includes an ability to decode the read codewords received from the circuit 94. The resulting decoded data is presented to the circuit 92 via the signal HOSTIO and/or re-encoded and written back into the circuit 94 via the signal NVMIO. The circuit 98 comprises one or more integrated circuits (or chips or die) implementing the controller of one or more solid-state drives, embedded storage, or other suitable control applications. In some embodiments, the circuit 98 is on a separate die as the circuits 96a-96n.

The circuit 100 is shown implementing a solid-state drive. The circuit 100 is generally operational to store data generated by the circuit 92 and return the data to the circuit 92. According to various embodiments, the circuit 100 comprises one or more: nonvolatile semiconductor devices, such as NAND Flash devices, phase change memory (e.g., PCM) devices, or resistive RAM (e.g., ReRAM) devices; portions of a solid-state drive having one or more nonvolatile devices; and any other volatile or nonvolatile storage media. The circuit 100 is generally operational to store data in a nonvolatile condition.

Figure 2:
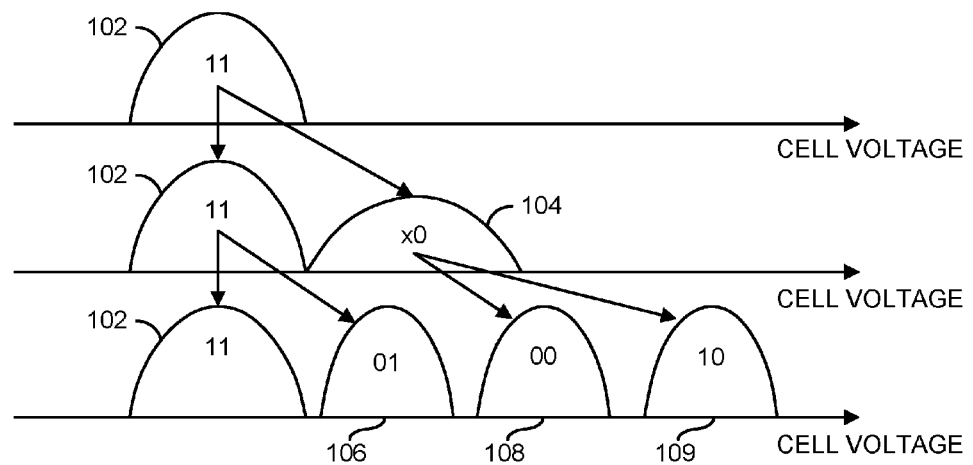
FIG. 2 is a diagram of a two-step programming process.

Referring to FIG. 2, a diagram of an example two-step programming process is shown. The process (or method) is illustrated for a multi-level cell in the circuits 96a-96n. All cells of an erase block are initially programmed (discharged) to an erased state 102. The erased state 102 generally represents multiple (e.g., two) bits, all with a logical one value (e.g., 11).

Given the two bits ($X_{MSB}$, $X_{LSB}$) to be stored in the cell, a charge is applied to the cell so that the voltage of the cell falls into the range that reflects the value of the least-significant bit of the two bits. The programming step results in a lower-page intermediate-state configuration. If the least-significant bit $X_{LSB}$ is a logical one, a null charge is applied and the cell remains in the erased state 102 (e.g., 11). If the least-significant bit $X_{LSB}$ is a logical zero, a charge is applied to the cell to move the cell into an intermediate state 104 (e.g., X0).

The lower-page intermediate-state data is subsequently read to obtain a noisy value of the least-significant bits, denoted by $X'_{LSB}$. Given the value of the most-significant bit $X_{MSB}$, programming continues to apply additional charge to the cell so that the cell voltage is moved (if possible) into the range corresponding to the bits ($X_{MSB}$, $X'_{LSB}$).

From the erased state 102, the additional charge is none if the most-significant bit is a logical one to leave the cell in the erased state 102. If the most-significant bit is a logical zero, additional change is added to the cell to shift the total charge to a state 106 (e.g., 01).

From the intermediate state 104, the additional charge is sufficient to move the cell into the state 108 (e.g., 00) if the most-significant bit is a zero. If the most-significant bit is a logical one, additional change is added to the cell to shift the total charge to a state 109 (e.g., 10).

The least-significant-bit page and the most-significant-bit page are written independently in the circuits 96a-96n to reduce inter-cell interference, and among other reasons, maintain a high write/read throughput by only using fine slow programming for the final states and a fast coarse programming of the intermediate states. In particular, to reduce cell-to-cell interference, the two step programming process is employed to reduce voltage swings in the fine programming step of aggressor interfering cells. Otherwise, large voltage swings of one-shot programming generally result in more neighborhood cell disturb. Furthermore, incremental write latency is linearly proportional to the voltage swings.

As part of the two step programming, the least-significant-bit page is sensed by the flash memory before programming the full wordline, leading to possible mis-programming when the most-significant-bit page is programmed based upon the sensed value having an error. The least-significant-bit page is not stored (error free) in the circuit 98 after writing to the circuit 94 in part because the intermediate state X0 has a wide distribution and does not have as much separation from the erased state 11 as the final states. The least-significant-bit page sensing process before the most-significant bit page write adds latency and affects write throughput if done through an off-die control circuit. Therefore, on-die error detection and correction codes are introduced to tradeoff latency (e.g., fast on-die decoding in write compared with off-die on-controller decoding) with mitigation of the write errors. The high-speed error detection and correction of the least-significant-bit pages before writing the most-significant-bit pages reduces the number of write errors once both pages have been fully programmed into the circuit 96a-96n. Furthermore, the high code rates and simple encoding/decoding in circuit 96a-96n is practical to implement.

Figure 3:
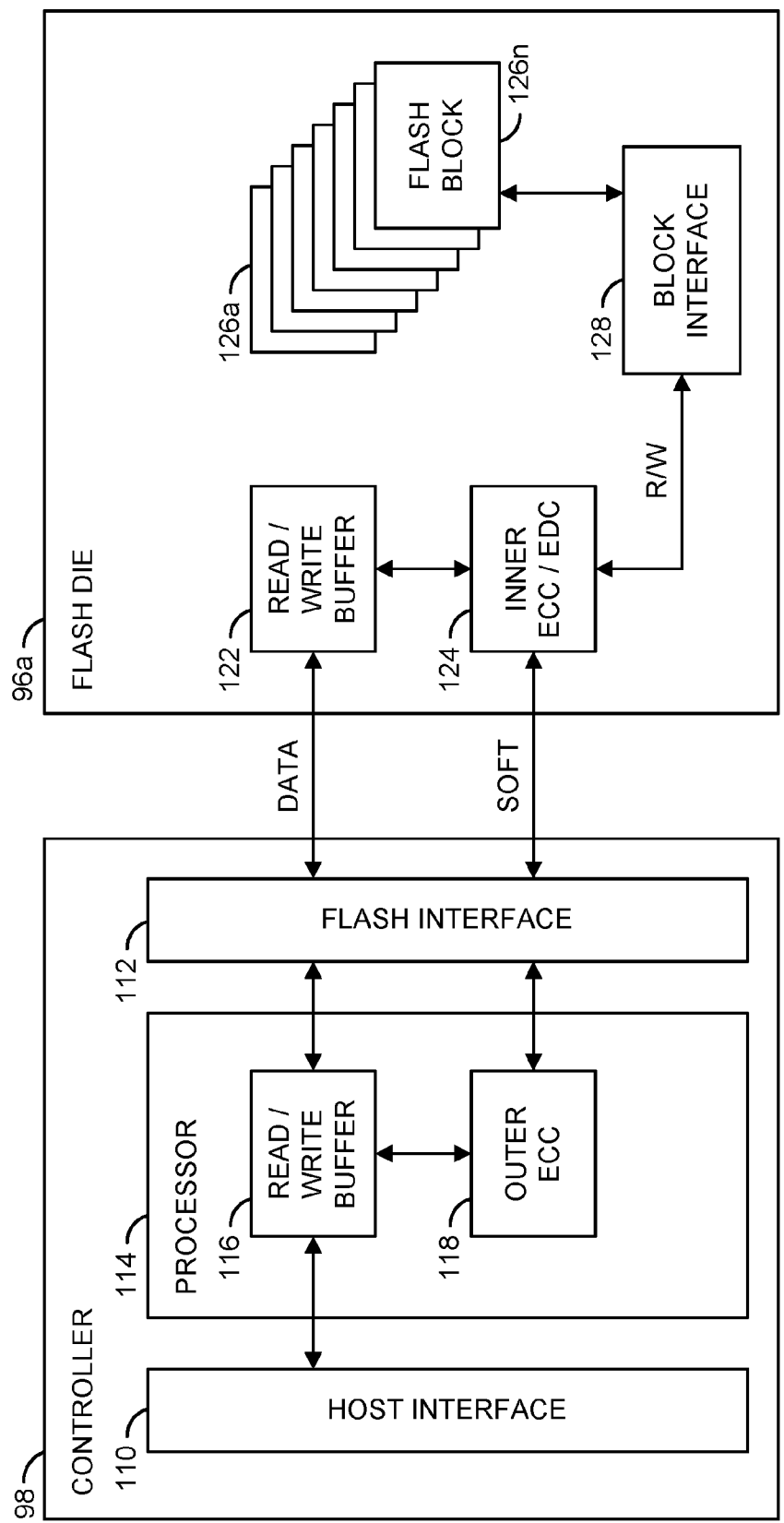
FIG. 3 is a block diagram of a circuit in accordance with an embodiment of the invention.

Referring to FIG. 3, a block diagram of an example implementation of the circuit 100 is shown in accordance with an embodiment of the invention. The circuit 100 generally comprises the circuits 96a-96n (only circuit 96a is shown for clarity), a block (or circuit) 110, a block (or circuit) 112, a block (or circuit) 114, a block (or circuit) 116, and a block (or circuit) 118. Each circuit 96a-96n generally comprises a block (or circuit) 122, a block (or circuit) 124, one or more blocks (or circuits) 126a-126n and a block (or circuit) 128. The circuits 110 to 128 may be represented as modules and/or blocks, embodiments of which include hardware (circuitry), code (e.g., hardware description languages (HDLs) such as register-transfer level (RTL), Verilog, etc.) used by one or more electronic design tools, computer executable code in a storage device, software and associated hardware executing the software, and/or other implementations.

The circuit 110 is shown implemented as a host interface circuit. The circuit 110 is operational to provide communication with the circuit 92 via the signal HOSTIO. Other signals may be implemented between the circuits 92 and 110 to meet the criteria of a particular application.

The circuit 112 is shown implemented as a nonvolatile memory (e.g., flash) interface circuit. The circuit 112 is operational to provide communication with the circuit 94 via the signal NVMIO. Other signals may be implemented between the circuits 94 and 112 to meet the criteria of a particular application.

The circuit 114 is shown implemented as a processor circuit. The circuit 114 is operational to command and/or assist with the multiple read/write requests and to control one or more reference sensing voltages used in the circuit 94 to read the codewords. In various embodiments, the circuit 114 is operational to calculate the soft-decision information used by the circuit 118. For some types of nonvolatile memory, the soft-decision information is generated based on one or more reads of a given codeword from the circuit 94 at different reference sensing voltages. Other types of flash memory are able to provide a form of the soft-decision information directly, such as a coarse (e.g., 3-bit resolution) voltage-level for each bit position. The soft-decision information is stored in the circuit 116.

The circuit 116 is shown implemented as a buffer circuit. The circuit 116 is operational to buffer codewords received from the circuit 94 via the circuit 112. The circuit 116 also buffers soft-decision information (e.g., log-likelihood ratios) generated by the circuit 114. The read codewords and the soft-decision information are presented from the circuit 116 to the circuit 118.

The circuit 118 is shown implemented as an outer error correction code/error detection code mapping circuit. The circuit 118 is generally operational to create (encode) outer error correction code information (e.g., parity bits) prior to transferring encoded data to the circuit 112. In some embodiments, the outer error correction code may be systematic.

The circuit 118 is also operational to decode the encoded data read from the circuit 94. The decoding generally utilizes the outer error correction code to detect and correct zero or more errors. The error detection and correction codes generally operate at one or more of (i) a codeword level, (ii) a page level and (iii) another level, such as a multi-page level and up to an erase-block level. In some embodiments, the circuit 118 implements a low-density parity check encoder/decoder. In other embodiments, the circuit 118 implements a Bose-Chaudhuri-Hocquenghem (e.g., BCH) encoder/decoder. Other hard-decision and/or soft-decision encoding/decoding techniques may be implemented to meet the criteria of a particular application.

The circuit 122 is shown implemented as a buffer circuit. The circuit 122 is operational to buffer pages received from the circuit 98 via the circuit 112, the blocks 126a-126n and the circuit 124. In various embodiments, the circuit 122 generally buffers lower-page intermediate-state information (e.g., lower-page only information for cells storing 2 bits each) corrected by the circuit 124 prior to the second phase of the multi-step write process.

The circuit 124 is shown implemented as an inner error correction code/error detection code mapping circuit. The circuit 124 is generally operational to create (encode) inner error correction code information (e.g., parity bits). In some embodiments, the inner error correction code may be systematic. As part of storing data, the circuit 124 is configured to (i) generate coded items by mapping one or more bits in each write unit using a modulation or recursion of past-seen bits, and (ii) calculate the particular states to program one or more bits of the coded items into the nonvolatile memory cells.

The circuit 124 is also operational to decode the encoded data read from the circuits 126a-126n. The decoding generally utilizes the inner error correction code to detect and correct zero or more errors. As part of decoding, the circuit 124 is configured to correct a read unit by reverse mapping the coded item per the modulation. The error detection and correction codes generally operate at one or more of (i) codeword level, (ii) a page level and (iii) another level, such as a multi-page level. In various embodiments, the circuit 124 implements a high-rate BCH encoder/decoder. In other embodiments, the circuit 124 implements a Hamming encoder/decoder. Other encoders/decoders may be implemented to meet the criteria of a particular application. Additional details regarding the use of the flash package based inner codes and the controller-based outer codes is available in co-pending application Ser. No. 14/308,911, which is hereby incorporated by reference in its entirety.

Each block 126a-126n is shown implementing a flash erase block in a circuit 96a-96n. Each block 126a-126n is operational to store data in a nonvolatile form. Writing (or programming) the cells of the blocks 126a-126n may cause write errors. Reading from the cells of the blocks 126a-126n may cause read errors. In various embodiments, the circuit 124 is operational to correct the write/read errors of the lower-page intermediate-state/least-significant-bit pages prior to being combined with most-significant-bit pages and programmed back into the blocks 126a-126n.

The circuit 128 is shown implementing a block interface circuit. The circuit 128 is generally operational to perform writing (programming) data into the blocks 126a-126n and reading data from the blocks 126a-126n. The write data is received by the circuit 128 from the circuit 124 via a read/write signal (e.g., R/W). The signal R/W also conveys the read data from the circuit 128 to the circuit 124.

In various embodiments, the high-rate low-power systematic inner error correction code/error detection code parity bits are combined with the outer error correction code parity bits to correct/reduce write errors that, for example, arise from programming multi-level-cell wordlines and/or compacting single-level-cell pages into a triple-level-cell page. In some embodiments, the outer error correction code encoder/decoder (e.g., the circuit 118) is implemented in the circuit 98 to create the outer code parity bits. In various embodiments, the inner error correction code encoder/decoder (e.g., circuit 124) is implemented in each flash die 96a-96n to create the inner code parity bits. Therefore, the inner code error correction coding/error detection/error correction process is seamless to the circuit 98. In various embodiments, the circuit 124 can be in the circuit 98.

When reading a least-significant-bit page, the circuit 124 corrects the least-significant-bit page before writing the corresponding most-significant-bit page to the wordline. The inner error correction code can also be used in conjunction with multiple internal reads of single-level-cell pages or least-significant-bit pages to reduce the occurrence of write errors when compacting single-level-cell pages into triple-level-cell pages or writing most-significant-bit pages, respectively.

When data is copied from single-level-cell pages to be compacted into a triple-level-cell page, the data is decoded by the circuit 124 instead of being transferred to the circuit 98 for decoding. In various embodiments, the circuit 124 generally provides low-latency decoding using, for example, a high-rate inner code on the die.

In the low-probability event that the circuit 124 fails to decode, the single-level-cell page of data can be sent to the circuit 98 through the circuit 112 to be decoded by the circuit 118. The outer error correction code can be a strong, low-rate BCH code or low-density parity check code. The inner code can be a systematic, weaker, higher-rate BCH, Hamming, or any other low-latency, low-power decodable code. In some embodiments, the inner code is systematic so that the data can be encoded/decoded with the outer code independent from the inner code. In other embodiments, the inner code and the outer code are treatable as a product code and decoded in conjunction with each other. The inner code generally has a high rate, consumes little power, and has a low latency to decode since the inner code is encoded and/or decoded inside the circuits 96a-96n.

The inner code parity bits are associated with data inside a page. In various embodiments, the inner code is over sub-potions of a page, or a full page. Generally, the inner code is applied over the smaller portions. The inner code may be used for detection only (e.g., disparity, or just cyclic-redundancy-check like). In some embodiments, the inner code offers correction (e.g., a block-code or convolutional-code), and may involve modulation, such as an error correction code modulation, a trellis code modulation, a controlled inter-cell interference (e.g., ICI) modulation, a rate-less inter-cell interference modulation and/or a pre-coded controlled inter-cell interference modulation.

Each circuit 96a-96n might or might not correct errors based on the inner code. In various embodiments and/or usage scenarios, each circuit 96a-96n generally encodes and decodes the inner code so the inner code is hidden from the circuit 98. In some embodiments, each circuit 96a-96n provides inner code check bits to the circuit 98 to enable product code-like processing (e.g., in the circuit 114). In various embodiments, each circuit 96a-96n does not use a full correction power of the inner code (e.g., only correcting 1 or 2 errors of a stronger inner code). The inner code can use direct soft-decision read information, or multiple hard reads to generate soft decisions for the outer code.

The inner code is generally used for several purposes. The inner code reduces error rates when reading lower-page intermediate-state data to write inside the circuits 96a-96n (e.g., when writing most-significant-bit data in multi-level cells, or when writing into triple-level cells). The circuit 124 uses the inner code to decide that the page is too corrupted to use without getting the controller 98 to correct the page with the outer code. In some embodiments, decoding based on the inner code utilizes soft-decision reads on the flash die to improve correction power, by directly accessing the analog voltages on the cells. The inner code aids in deciding the mapping of encoded data into multiple voltage states to modify log-likelihood ratio values corresponding to write errors. In various embodiments, the inner code is implemented in the circuits 96a-96n and is used to return/modify soft-decision information for either compacting or returning to the controller.

If the inner code is a block-code, detected coding failures can be used to erase a full codeword. If the inner code is a trellis code, writing shifted voltage levels is enabled when copying within the circuits 96a-96n (e.g., multiple single-level-cell page compaction into a triple-level-cell page). For example, a single-level cell is used as a 4-state system, so copying (compacting) single-level-cell data to multi-level-cell data produces 16 states, and copying (compacting) single-level-cell data to triple-level-cell data produces 64 states.

In some embodiments, the outer code is implemented within a same sub-portion of a page as the inner code. In other embodiments, the outer code is implemented across a full flash page and/or across multiple flash pages. The outer code may also be implemented across most-significant-bit pages and least-significant-bit pages (or similarly, all levels of triple-level cells).

The impact of write errors is reduced in some embodiments using trellis coded modulation. The trellis code modulation adds redundancy to the user data using convolutional type codes and maps the resulting multi-bit symbols into more states than the useful states to represent user bits. For example, a rate ½ convolutional code encodes the user data and the mapping allocates the encoded data into two cell states per user bit. As a result, each single-level-cell type nonvolatile memory cell stores 4 states instead of the normal 2 states, each multi-level cell stores 16 states instead of the normal 4 states, and each triple-level cell stores 64 states instead of the normal 8 states. Another example is a rate ⅔ convolutional code, where each multi-level cell stores 8 states corresponding to 2 user bits and 1 parity bit. In a similar fashion, the cells are used where every other cell stores 4 states and the rest 2 states.

Some embodiments of the mapping technique entail adding more analog states than normally used to represent the user data in order to fully or partially compensate for a drop in a user throughput rate resulting from the added parity bits. For data detection, more reads are performed to hard read the user bits than in normal systems without the encoding. Even more reads may be used in retries to provide higher quality soft-decision information from the detectors to the soft-decision decodable error correction code.

Figure 4:
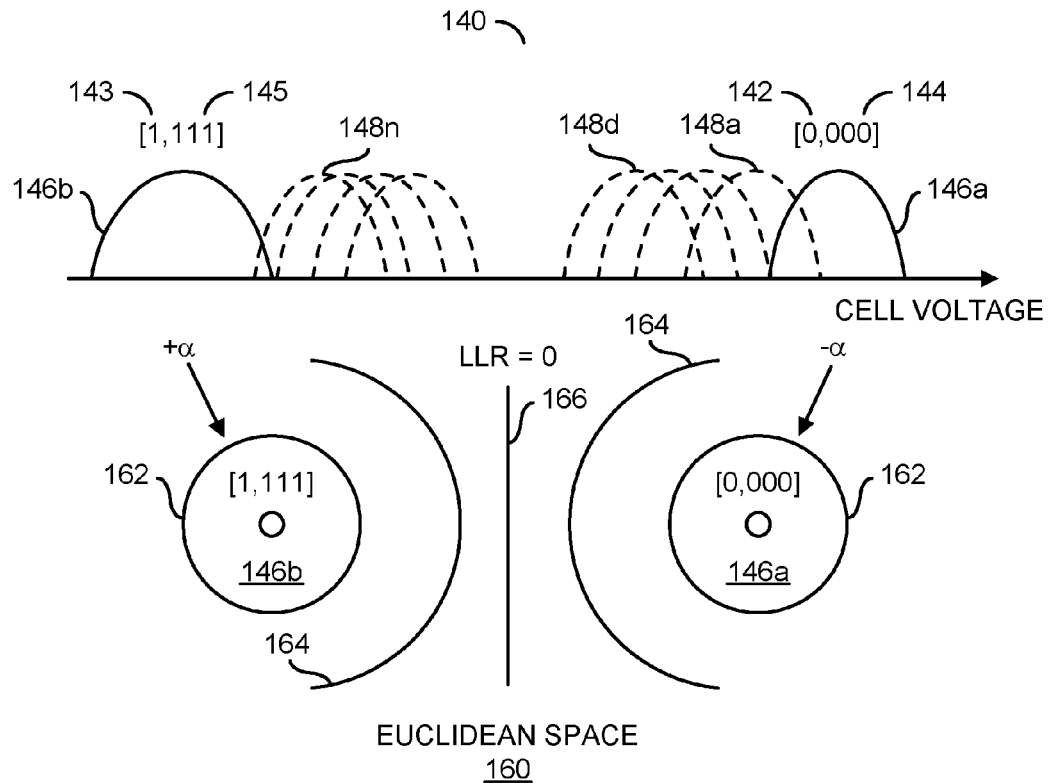
FIG. 4 is a diagram of a divided voltage window.

Referring to FIG. 4, a diagram of an example divided voltage window 140 is shown. Programming a current logical zero bit 142 is generally based on a past bit sequence 144. Programming a current logical one bit 143 is generally based on a past bit sequence 145. The voltage window 140 is between original states 146a-146b and is partitioned into multiple states 146a-146b and 148a-148n. The two original states 146a-146b establish the outer edges of the window 140. Data is programmed such that a single write error does not correspond to the full voltage swing between the window extremes. Therefore, single write errors do not result in saturated or high magnitude log-likelihood ratio values for incorrectly programmed bits. Consider, for example, a current logical one bit 143 having the history (e.g., earlier sequential bits) of several logical one bits 145 corresponding to both user and parity bits. A memory cell should be programmed by the current bit 143 into the state 146b. However, the current bit 143 is incorrectly treated as a logical zero bit. Due to the history bits 145 (e.g., the "111" parity bits in a repetition code or previous bits in the user non-coded written sequence), the current sequence of "1111" is incorrectly treated as a sequence "0111". Therefore, the circuit 128 programs the current bit 143 into an intermediate state (e.g., 148d) instead of the (incorrectly programmed) state 146a. Viewed from a Euclidean space 160, the state 148d may reside outside a one-bit Hamming error boundary 162 and near a two-bit Hamming error boundary 164 away from the state 146a. A subsequent read of the incorrectly programmed current bit finds the memory cell in the state 148d somewhere between the one-bit Hamming error boundary 162 and a median divider 166. The median divider 166 is where the probability that the memory cell holds a user bit logical one matches the probability that the memory cell holds a user bit logical zero (e.g., LLR=0). Hence, the soft-decision information (e.g., log-likelihood ratio value) of the current bit is a non-saturated value. The non-saturated value makes proper error detection and correction by the soft-decision decoder more probable.

Consider for example another configuration to detect stuck cells, where multiple bits correspond to past user bits only and no added parity. If an all logical zero sequence is to be written without errors, the state 146a is programmed repeatedly. If a single logical one in the all zero sequence is inserted, the states 0000, 0001, 0010, 0100, 1000, and 0000 again are written in sequence. While if a cell is stuck at say 0010, the observed sequence would be 0000, 0010, and 0000, which is readily distinguishable from the earlier legitimate sequence. In different embodiments, the extra bits in 144 can be all parity bits, all previous user bits, or a combination of parity bits of the inner code, parity bits of outer code, and previous past seen user bits. In different embodiments, the mapping of written bits to state labels in 142 and 144 is not constrained to be all similar value bits, where for example state 146a can be labeled by any combination of 1's and 0's in the context of any mapping to refined states so that single write misplacement errors are detectable.

In various embodiments, intentional inter-cell dependencies are introduced by the mapping to store the information about the current bit in the value of other bits. The inter-cell dependencies generally protect against a total loss of information caused by mis-programming the cell holding the current bit. The user information is stored as sequences of bits rather than individual single bits. The receiver/reader reads several cells to calculate the soft-decision information or likelihood of the current bit.

Without such techniques, a write error of a single bit generally results in a saturated log-likelihood ratio value of the current bit that fools a soft-decision decoder, such as a low-density parity check (e.g., LDCP) decoder. Calculating the log-likelihood ratio value for the entire sequence ensures that no single bit error provides a misguided hard decision. The mapping increases Euclidean-space distances between likely sequences (typical or legitimate) from single bit errors to multiple bit errors to prevent single bit errors from resulting in high confidence log-likelihood ratio values that affects the convergence success rate of the soft-decision decoder.

Due to the controlled inter-cell dependencies, if any bit has a "stuck" error, a modified log-likelihood ratio value can be determined based on neighbors (temporally and/or spatially) of the current bit. The modified log-likelihood ratio values are useful in scenarios where most errors are hard types, such as the hard errors commonly found at an end of life of the flash die, or whenever write errors are more dominant than Gaussian noise errors. In various embodiments, only bad blocks are written using the controlled inter-cell dependencies. Good certified blocks are written without the controlled inter-cell dependencies.

Figure 5:
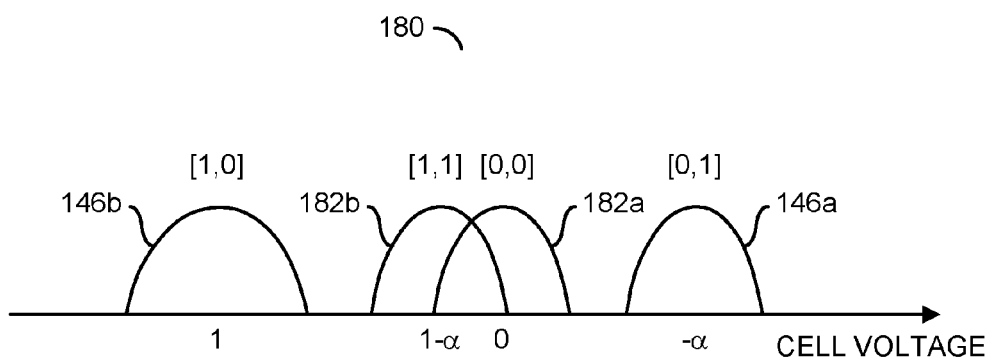
FIG. 5 is a diagram of a controlled inter-cell-interference window.

Referring to FIG. 5, a diagram of an example controlled inter-cell interference window 180 is shown. The user bits $u(i) \in \{0,1\}$ are modulated with a function $y(i)=u(i)-\alpha u(i-1)$, where a value of a is close to 1. The bits are mapped as follows:

[u(i),u(i−1)]=[0,0] is mapped to cell state 0 (e.g., state 182a)
[u(i),u(i−1)]=[0,1] is mapped to cell state −α (e.g., state 146a)
[u(i),u(i−1)]=[1,0] is mapped to cell state 1 (e.g., state 146b)
[u(i),u(i−1)]=[1,1] is mapped to cell state 1−α (e.g., state 182b)

A write error that flips the current bit u(i) from logical zero (e.g., [0,0]) to logical one (e.g., [1,0]), with the neighboring bit u(i−1) at logical zero, programs the cell in the state 146b when the cell should have been programmed in the state 182a. Therefore, the voltage swing caused by the write error is 1 (unity), which is less than the voltage swing of 1+α between the outer states 146a to 146b. Without the mapping, incorrectly writing the current bit as a logical one in the state 146b instead of a logical zero in the intended state 146a results in a voltage swing of 1+α, and thus creates a larger log-likelihood ratio value than the voltage swing of 1.

A write error that flips the current bit u(i) from logical one (e.g., [1,1]) to logical zero (e.g., [0,1]), with the neighboring bit u(i−1) at logical one, programs the cell in the state 146a instead of the state 182b. The resulting voltage swing caused by the write error is 1 (unity), which is less than the swing of 1+α between the outer states 146a to 146b. Similar less-than-maximum voltage swings exist for the other combinations of flipped current bits and neighboring bits due to the mapping.

In some embodiments, if u(i) is some function of bit u(i−1), some state placements will indicate a single write error has occurred. For instance, if u(i) is the inverse of u(i−1), states [0,0] and [1,1] are illegal states that occur if a single bit flips before writing or the cell voltage is stuck in that voltage region. Hence, if soft decisions are generated by making multiple reads around the equal likelihood sensing voltage (1−α)/2, the resulting log-likelihood ratios will not be saturated in fixed points or have a high magnitude. Direct soft information, if available, will also indicate the voltage is somewhere midway between the only legitimate states 146a and 146b and a likely single error will be detected by the soft-decision decoder by virtue of the associated low magnitude decision reliability value.

In some embodiments, u(i) is the current bit and u(i−1) is the previous bit appearing in the written sequence, hence, some occurrences of consecutive voltage states are not typical or even illegal. If a single writing-time error in the writing sequence occurs, the sequence of states (temporally) or voltage states of adjacent cells or consecutive cells differs from the legal expected sequence. For instance, an all zero sequence means the state 182a is written to consecutive cells, and if a logical 1 is to be written it appears in two adjacent or consecutive cells as state [1,0] (146b) first and [0,1] (146a) next, and finally back to consecutive states 182a. On the other hand, if any of the states 146a, 182b, or 146b is observed isolated in a sequence of cells all programmed to 182a, a single write error likely occurred. Multiple write errors occurring at the same time or in combination with read errors is possible but far less typical. Another example is a an all-zero sequence with a "11" pattern inserted. The expected states to be programmed are 182a, 146b, 182b, 146a and back to 182a. Hence, any isolated observation of 182b is indicative of a write error.

Figure 6:
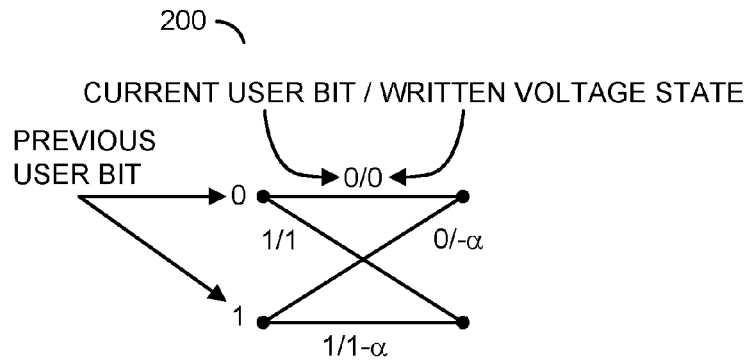
FIG. 6 is a diagram of a trellis representation of a controlled inter-cell-interference mapping.

Referring to FIG. 6, a diagram of an example trellis 200 representation of a controlled inter-cell interference mapping is shown. A left value X in the notation "X/Y" generally represents a current user bit. A right value Y in the notation represents the written voltage state. The branches of the trellis 200 correspond to the cell voltages −α, 0, 1−α and 1 in FIG. 5. Two possible states of the previous bit (e.g., Z) and combined with the current user bit (e.g., X) result in four possible sequences represented by trellis branches:

[u(i),u(i−1)]=[x=0,z=0] is mapped to cell state 0 (e.g., state 182a)
[u(i),u(i−1)]=[x=0,z=1] is mapped to cell state −α (e.g., state 146a)
[u(i),u(i−1)]=[x=1,z=0] is mapped to cell state 1 (e.g., state 146b)
[u(i),u(i−1)]=[x=1,z=1] is mapped to cell state 1−α (e.g., state 182b)

Figure 7:
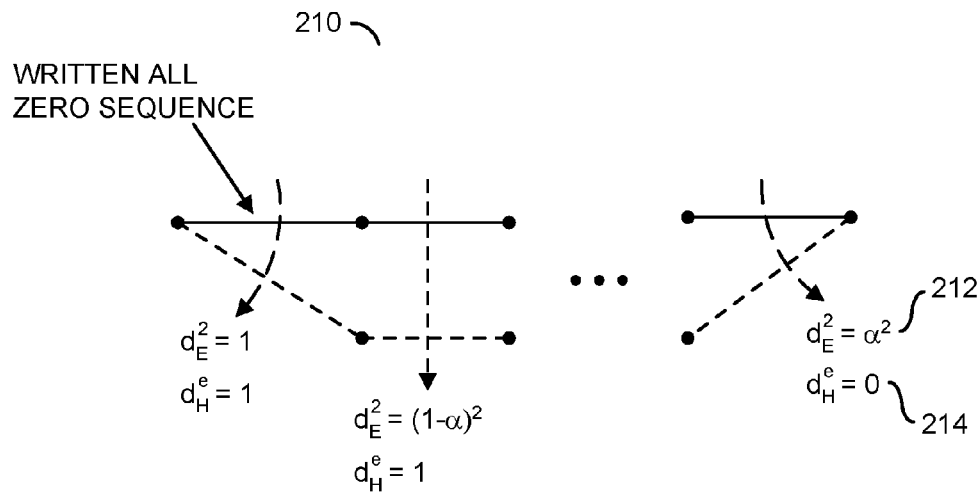
FIG. 7 is a diagram of a trellis representation of a most likely sequence.

Referring to FIG. 7, a diagram of an example trellis 210 representation of a most likely sequence is shown given that the all-zero sequence is written. The trellis 210 illustrates a most likely error sequence given an all-zero written sequence starting from a previous user bit u(i−1) of logical zero. A distance 212 generally represents a Euclidean distance. A distance 214 represents a Hamming distance. The shortest likely error sequence is [1,0], corresponding to voltage states 146a and 146b in FIG. 5, which has a cumulative Euclidean distance of $1+\alpha^2$.

Figure 8:
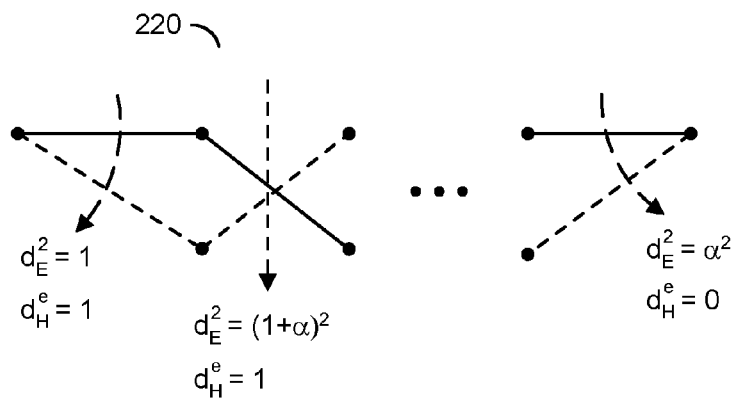
FIG. 8 is a diagram of a trellis representation of a least likely sequence.

Referring to FIG. 8, a diagram of an example trellis 220 representation of a least likely sequence is shown. The trellis 220 illustrates least likely error sequences starting from a previous user bit u(i−1) of logical zero.

In the memory-less mapping of a same voltage window size as the window 180, a "0" is mapped to −α, and "1" is mapped to +1 volts (normalized). If a write error occurs, and a "0" is written to "1", the log-likelihood ratio value saturates at −16, assuming that α=1 and a Gaussian noise variance is $\sigma^2=\frac{1}{4}$. The Euclidean distance of the read voltage state to the original sequence is a measure of the reliability of the decision.

The most likely error sequence occurs (e.g., FIG. 7) when runs of "0" are written, such as "00", "000", and so on. A run is generally denoted by {0}n, where n is the sequence length. The Euclidean distance grows linearly as a result: $1+\alpha^2+(n-2)(1-\alpha)^2$.

When a cell is stuck or mis-programmed to a value of +1 volts and the next bit is correctly programmed at 0 volts, the Euclidean distance of that error event to the correct "00"

sequence is +4, and the Euclidean distance to the most likely shortest sequence "10" is also +4. As a result, the corresponding log-likelihood ratio value (a difference of the two metrics) is zero. Therefore, the cell is marked as erased. The erasure helps the soft-decision decoder correct the error compared with the mapping where the log-likelihood ratio value is of the wrong sign and has a high magnitude (e.g., LLR=16).

Figure 9:
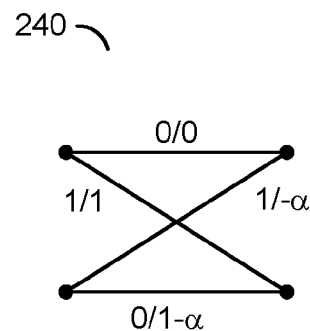
FIG. 9 is a diagram of a trellis representation of a pre-coded controlled inter-cell-interference mapping.

Referring to FIG. 9, a diagram of an example trellis 240 representation of a pre-coded controlled inter-cell-interference mapping is shown. A left value X in the notation "X/Y" generally represents a current user bit. A right value Y in the notation represents the written voltage state. The branches of the trellis 200 correspond to the cell voltages $-\alpha$, 0, $1-\alpha$ and 1 in FIG. 5.

Figure 10:
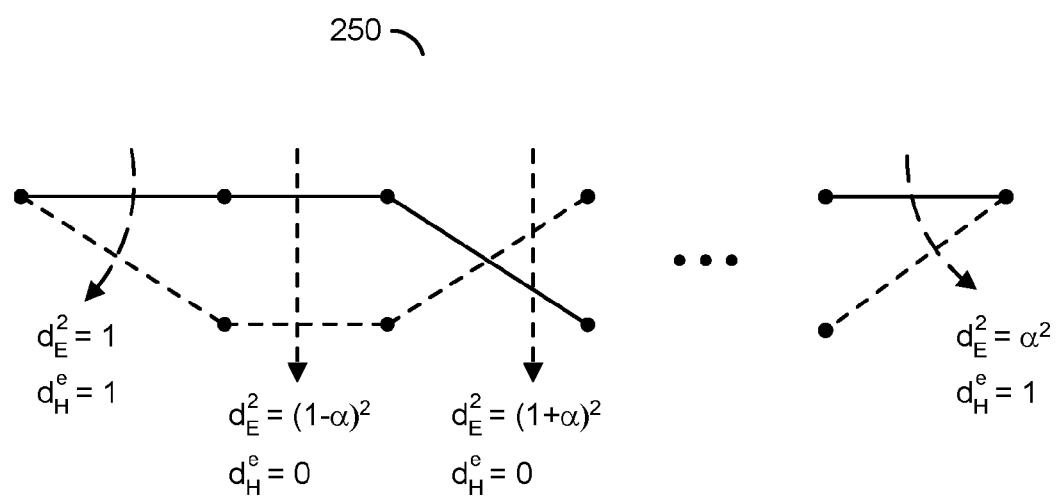
FIG. 10 is a diagram of a trellis representation.

Referring to FIG. 10, a diagram of an example trellis 250 is shown. The current user bit u(i) is coded with a function modulo(y(i)+y(i−1),2)=u(i). The function y(i) is modulated using a function z(i)=y(i)−αy(i−1) when writing to a memory channel. Errors caused by Gaussian noise are at least of a Hamming distance 2 (e.g., two bit errors). The Hamming distance 2 means that single write errors are distinguishable from sequence errors. Error events of the pre-coded controlled inter-cell interference are similar to that of the controlled inter-cell interference.

A signal-to-noise ratio is generally decreased due to the states being packed more closely to accommodate adding memory (temporal and/or spatial) in an encoded bit stream. However, if write errors are the dominant source of errors and the mapping is not implemented, a soft-decision decoder processing errors with large log-likelihood ratio values behaves only as good as a hard-decision input decoder. In the latter case, the signal-to-noise ratio of the added electronic white noise is less limiting, and the number of write errors determines the soft-decision decoding success rate, where the soft-decision decoder would thus resemble a hard-decision decoder.

Implementing a memory-based log-likelihood ratio generator (soft-decision out sequence detector), the log-likelihood ratio values are based on bit sequences of a current bit and old bits. The resulting improvement in the log-likelihood ratio value quality (e.g., modified log-likelihood ratio values for write error locations) more than compensates for the signal-to-noise ratio reduction caused by tightly spaced states. The method of non-recursive mapping has an advantage over embodiments based on the inner convolutional codes or the inner pre-coders, as the latter can exhibit error bursts if designed to be recursive.

The functions performed by the diagrams of FIGS. 1-10 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A method for mitigating hard errors, comprising the steps of:
   creating a plurality of inter-bit dependencies between a current bit in a sequence of data bits and a plurality of neighboring bits in the sequence of data bits to generate a plurality of mapped bits;
   writing the plurality of mapped bits among at least two cells of a plurality of memory cells in a memory with at least two of the plurality of mapped bits stored in each of the plurality of memory cells;
   generating a plurality of log-likelihood ratio values in response to reading the plurality of mapped bits from the memory, wherein each of the log-likelihood ratio values is based on two or more of the mapped bits and is representative of the plurality of inter-bit dependencies, and the plurality of inter-bit dependencies mitigate a hard error due to one of the at least two cells being stuck in a fixed state; and
   decoding the plurality of mapped bits based on the plurality of log-likelihood ratio values to recover the current bit.

2. The method according to claim 1, wherein the plurality of inter-bit dependencies result in a less than saturated value in the plurality of log-likelihood ratio values due to a single-bit write error among the plurality of mapped bits.

3. The method according to claim 1, wherein the plurality of inter-bit dependencies are created using a modulation of the plurality of neighboring bits.

4. The method according to claim 1, further comprising the step of:
   encoding data to generate the current bit and the plurality of neighboring bits.

5. The method according to claim 1, wherein the plurality of inter-bit dependencies are created using a recursion of the plurality of neighboring bits.

6. The method according to claim 1, wherein the plurality of inter-bit dependencies increase a Euclidean-space distance between likely bit sequences to greater than a single-bit error.

7. The method according to claim 1, wherein the plurality of inter-bit dependencies adjusts a written state voltage of the mapped bits in the memory in response to a most recent one of the plurality of neighboring bits being a logical one bit.

8. The method according to claim 1, wherein the steps are performed in a solid-state drive controller.

9. An apparatus comprising:
   an interface configured to process a plurality of read/write operations to/from a memory; and
   a control circuit configured to create a plurality of inter-bit dependencies between a current bit in a sequence of data bits and a plurality of neighboring bits in the sequence of data bits to generate a plurality of mapped bits, write the plurality of mapped bits among at least two cells of a plurality of memory cells in the memory with at least two of the plurality of mapped bits stored in each of the plurality of memory cells, generate a plurality of log-likelihood ratio values in response to reading the plurality of mapped bits from the memory, and decode the plurality of mapped bits based on the plurality of log-likelihood ratio values to recover the current bit, wherein each of the log-likelihood ratio values is based on two or more of the mapped bits and is representative of the plurality of inter-bit dependencies, and the plurality of inter-bit dependencies mitigate a hard error due to one of the at least two cells being stuck in a fixed state.

10. The apparatus according to claim 9, wherein the plurality of inter-bit dependencies result in a less than saturated value in the plurality of log-likelihood ratio values due to a single-bit write error among the plurality of mapped bits.

11. The apparatus according to claim 9, wherein the plurality of inter-bit dependencies are created using a modulation of the plurality of neighboring bits.

12. The apparatus according to claim 9, wherein the control circuit is further configured to encode data to generate the current bit and the plurality of neighboring bits.

13. The apparatus according to claim 9, wherein the plurality of inter-bit dependencies are created using a recursion of the plurality of neighboring bits.

14. The apparatus according to claim 9, wherein the plurality of inter-bit dependencies increase a Euclidean-space distance between likely bit sequences to greater than a single-bit error.

15. The apparatus according to claim 9, wherein the plurality of inter-bit dependencies adjusts a written state voltage of the mapped bits in the memory in response to a most recent one of the plurality of neighboring bits being a logical one bit.

16. The apparatus according to claim 9, wherein the memory and the control circuit are part of a solid-state drive.

17. An apparatus comprising:
   a memory configured to store data; and
   a controller configured to create a plurality of inter-bit dependencies between a current bit in a sequence of data bits and a plurality of neighboring bits in the sequence of data bits to generate a plurality of mapped bits, write the plurality of mapped bits among at least two cells of a plurality of memory cells in the memory with at least two of the plurality of mapped bits stored in each of the plurality of memory cells, generate a plurality of log-likelihood ratio values in response to reading the plurality of mapped bits from the memory, and decode the plurality of mapped bits based on the plurality of log-likelihood ratio values to recover the current bit, wherein each of the log-likelihood ratio values is based on two or more of the mapped bits and is representative of the plurality of inter-bit dependencies, and the plurality of inter-bit dependencies mitigate a hard error due to one of the at least two cells being stuck in a fixed state.

18. The apparatus according to claim 17, wherein the plurality of inter-bit dependencies result in a less than saturated value in the plurality of log-likelihood ratio values due to a single-bit write error among the plurality of mapped bits.

19. The apparatus according to claim 17, wherein the plurality of inter-bit dependencies increase a Euclidean-space distance between likely bit sequences to greater than a single-bit error.

20. The apparatus according to claim 17, wherein the memory and the controller are part of a solid-state drive.

* * * * *